US 8,499,268 B2

Jul. 30, 2013

(12) United States Patent
Okabe

(10) Patent No.: US 8,499,268 B2
(45) Date of Patent: Jul. 30, 2013

(54) METHOD OF SUPPORTING LAYOUT DESIGN OF SEMICONDUCTOR INTEGRATED CIRCUIT

(75) Inventor: Hideyuki Okabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/404,820

(22) Filed: Feb. 24, 2012

(65) Prior Publication Data

US 2012/0221992 A1 Aug. 30, 2012

(30) Foreign Application Priority Data

Feb. 24, 2011 (JP) .................................. 2011-38869

(51) Int. Cl.
   *G06F 17/50* (2006.01)
(52) U.S. Cl.
   USPC ............ 716/113; 716/119; 716/122; 716/126
(58) Field of Classification Search
   USPC .................. 716/113, 119, 122, 126
   See application file for complete search history.

(56) References Cited

U.S. PATENT DOCUMENTS

| 6,301,692 | B1 * | 10/2001 | Kumashiro et al. ........... 716/119 |
| 7,962,886 | B1 * | 6/2011 | Pandey et al. ................ 716/136 |
| 8,020,127 | B1 * | 9/2011 | Chan et al. ................... 716/108 |
| 8,181,130 | B1 * | 5/2012 | Fender ........................ 716/103 |
| 2003/0079192 | A1 * | 4/2003 | Cheong et al. .................. 716/7 |
| 2008/0148203 | A1 * | 6/2008 | Alpert et al. .................... 716/6 |

FOREIGN PATENT DOCUMENTS

JP 2008-112299 5/2008

\* cited by examiner

*Primary Examiner* — Vuthe Siek
*Assistant Examiner* — Magid Dimyan
(74) *Attorney, Agent, or Firm* — Young & Thompson

(57) ABSTRACT

In a method of supporting a layout design, a net list of an integrated circuit is divided into net lists of clock domain circuit aggregations. A timing constraint is generated to each of the clock domain circuit aggregations. An arrangement order of the clock domain circuit aggregations is determined to satisfy the timing constraint. A layout of the integrated circuit is generated by carrying out arrangement and wiring of the clock domain circuit aggregations based on the arrangement order.

18 Claims, 13 Drawing Sheets

METHOD OF SUPPORTING LAYOUT DESIGN OF SEMICONDUCTOR INTEGRATED CIRCUIT

CROSS REFERENCE

This patent application claims a priority on convention based on Japanese Patent Application No. JP 2011-38869. The disclosure thereof is incorporated herein by reference.

TECHNICAL FIELD

The present invention is related to a technique of a layout design of a semiconductor integrated circuit (especially, LSI circuit), and for example, related to a layout design technique for timing convergence.

BACKGROUND ART

In a technique of a layout design of an LSI circuit, the need of a method of supporting a layout design increases in which the timing convergence can be attained without increasing TAT (Turn Around Time) with increase of a circuit scale and operation speed in the LSI circuit.

Patent Literature 1 (especially, reference to FIG. 3 and page 2) describes a technique for sufficiently shortening TAT by a hierarchy layout design method in case of development of an LSI circuit. In this technique, preprocessing is carried out to extract a timing error path from the result of flat arrangement and wiring in the whole LSI circuit through STA (Static Timing Analysis) in case of dividing a net list of the LSI circuit into layers. After that, a region which contains a timing error path is divided into hierarchy layout blocks (HLBs) and a layer layout is attained every HLB.

FIG. 1A and FIG. 1B are a flow chart showing a procedure of Patent Literature 1. Arrangement and wiring processing and timing analysis processing are carried out based on a flat physical design data of the whole LSI circuit (Step S1). A path where a timing error has occurred is extracted (Step S2). A region which contains the extracted path is divided into hierarchy layout blocks (HLBs) (Steps S3 to S7). A timing constraint is divided every HLB (Step S8). A layout is carried out every HLB based on the timing constraint (Steps S9 to S11). A flat physical design data is generated by combining laid HLB data (Step S12).

CITATION LIST

Patent Literature 1: JP 2008-112299A

SUMMARY OF THE INVENTION

In the conventional technique exemplified by Patent Literature 1, the number of times of iteration for timing convergence increases so that TAT of the layout design increases. An LSI circuit in these days is mounted with tens of millions of logic gates and has tens of clock systems, and moreover one clock system is connected to a plurality of logic modules. Therefore, as in Patent Literature 1, if all the circuits and all the clock systems are connected in the preprocessing for a hierarchy layout, in other words, the whole of LSI circuit is arranged and wired flatly, all the circuits are arranged based on connection relation of the circuits. As a result, a possibility increases that a local arrangement congestion and a wiring congestion which accompanies it and moreover the wiring detour occur.

Specifically, in a LSI circuit with five clock systems and 20,000,000 logic gates, the local arrangement and wiring congestion occur in about 10% of the chip and the wiring detour occurs with this.

Therefore, when many timing errors occur as well as the wiring congestion in an initial stage of flat arrangement and wiring (the preprocessing for the hierarchy layout in the conventional technique), an area for size-up of a cell and an area for inserting a repeater for the purpose of the timing convergence are lacking in the HLB in case of the layout of HLB (in other words, a hierarchy layout) after the division into HLBs. As a result, the timing convergence cannot be attained in the HLB, and the control flow returns to the start and needs the review of a floor plan.

Also, for the division into the HLBs, it is necessary to carry out timing budget and distribute a clock delay among the HLBs to the respective HLBs. Depending on the timing budget and the distribution of the clock delay among the HLBs to the respective HLBs, the HLB in which the timing is server appears, and the iteration for the timing convergence increases more.

It is desired to shorten TAT of the timing convergence after the layout design.

A method of supporting a layout design is achieved by dividing a net list of an integrated circuit into net lists of clock domain circuit aggregations; by generating a timing constraint to each of the clock domain circuit aggregations; by determining an arrangement order of the clock domain circuit aggregations to satisfy the timing constraint; and by generating a layout of the integrated circuit by carrying out arrangement and wiring of the clock domain circuit aggregations based on the arrangement order.

According to the present invention, a layout object circuit is divided every clock domains. By arranging and wiring the clock domain circuit aggregations from aggregation having severer timing, timing convergence of the path having the severer timing can be carried out primarily in a state of free area. As a result, TAT of the timing convergence after layout design can be shortened.

DESCRIPTION OF EMBODIMENTS

Hereinafter, a layout design supporting system according to embodiments will be described with reference to the attached drawings.

First Embodiment

Figure 1A:
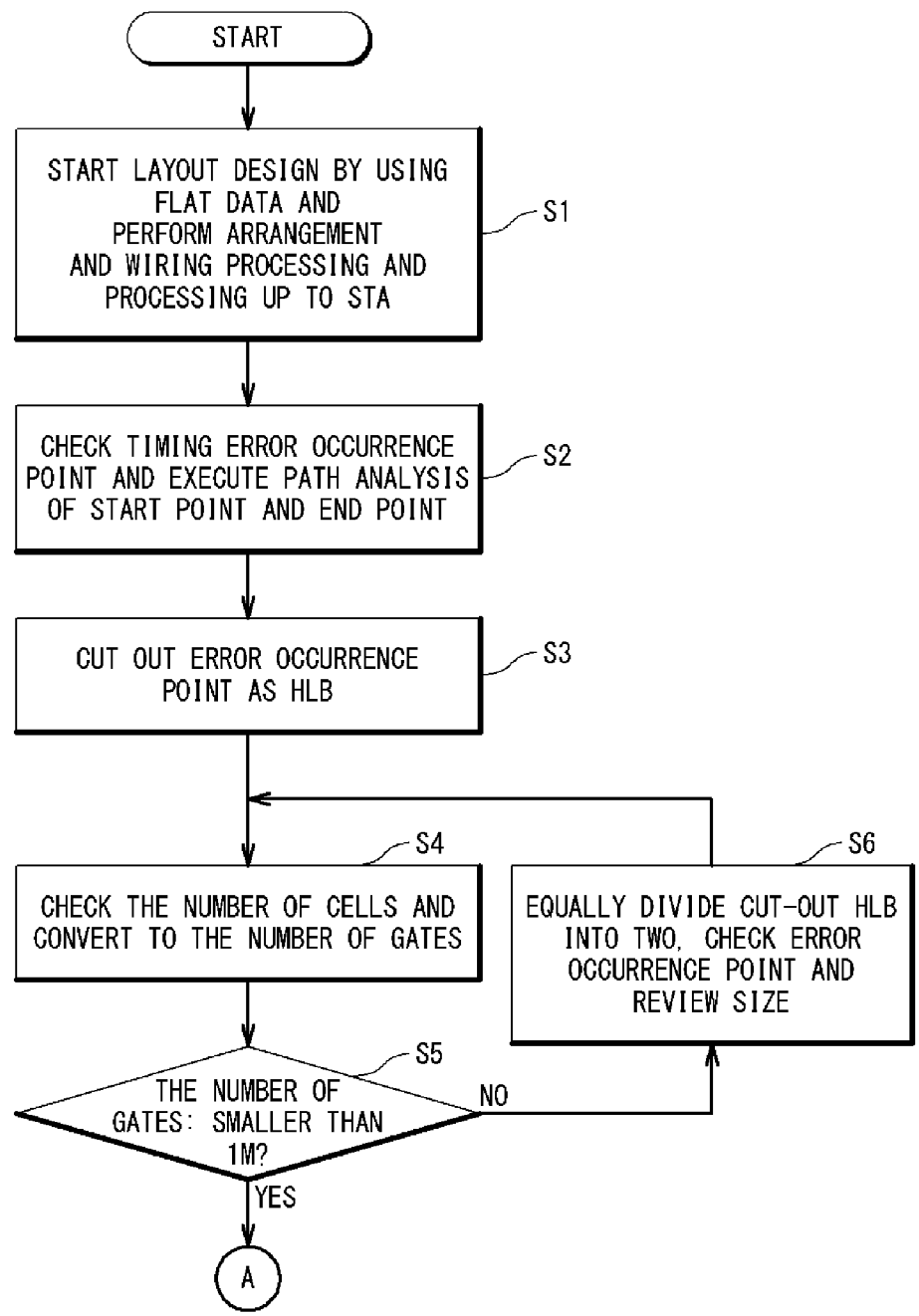
FIG. 1A is a flow chart showing a procedure of a conventional technique.
Figure 1B:
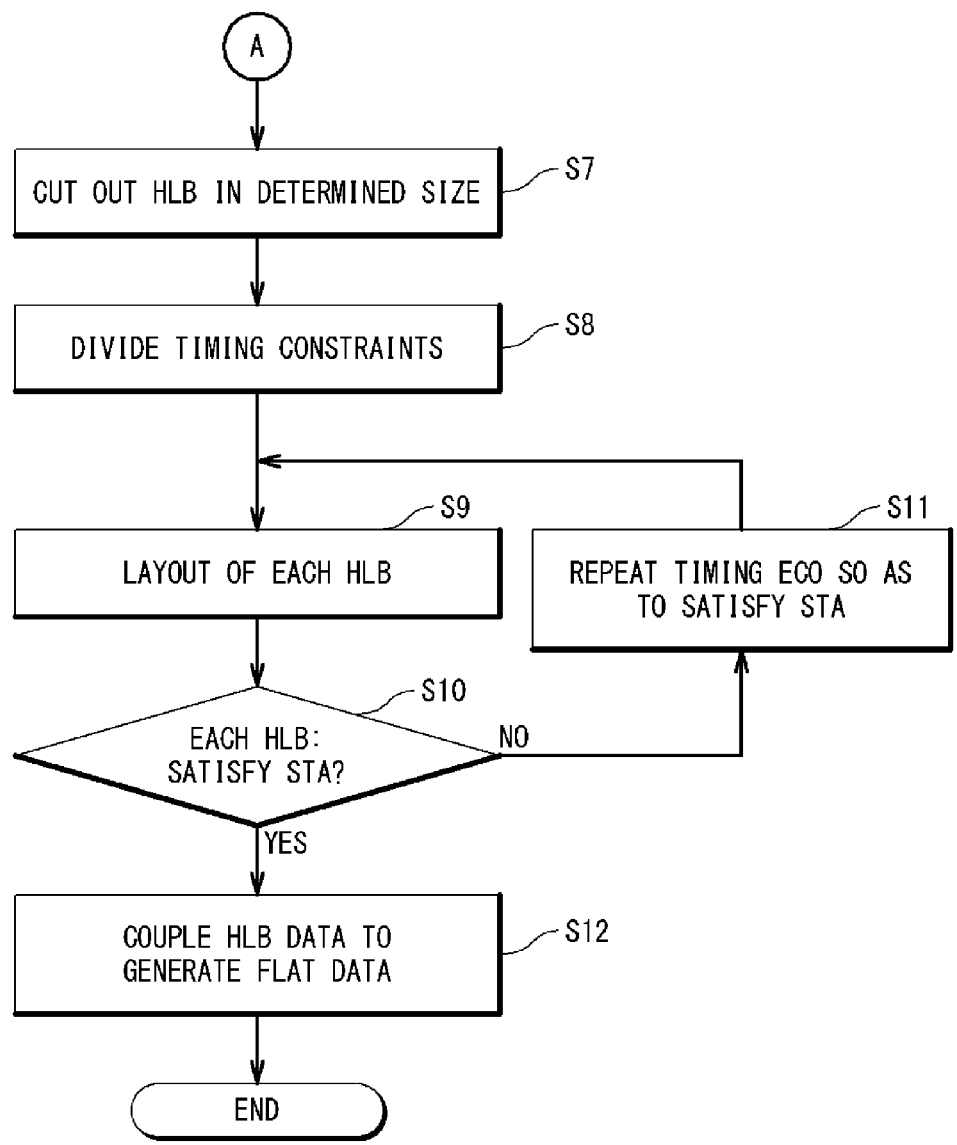
FIG. 1B is a flow chart showing the procedure of the conventional technique.
Figure 2:
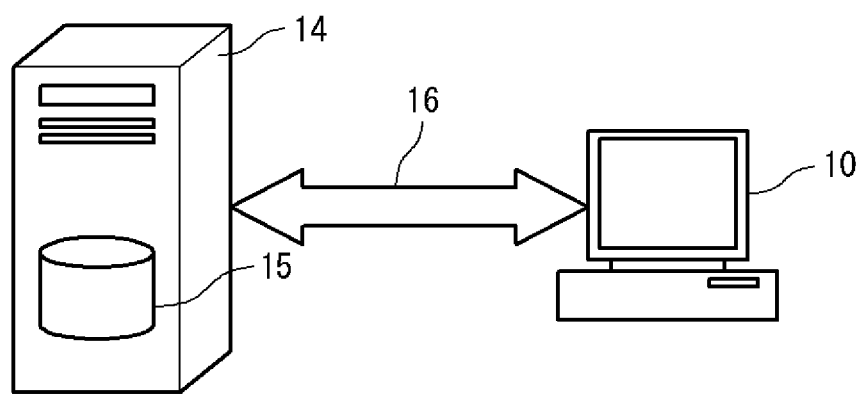
FIG. 2 is a configuration diagram of a system for executing processing of the present invention.

FIG. 2 is a block diagram showing a system configuration of the layout design supporting system according to a first embodiment. This system is provided with a computer terminal 10, a server 14, a storage unit 15 and a network 16. The storage unit 15 is contained in the server 14 to store an execution program. The server 14 is connected with the computer terminal 10 such as an engineering workstation through the network 16 such as the Internet. The execution program is stored in the storage unit 15 and is downloaded into the computer terminal 10 through the network 16. The execution program may be installed from a storage medium into the computer terminal 10. The downloaded program is stored in a local hard disk or a memory and so on in the computer terminal 10.

Figure 3:
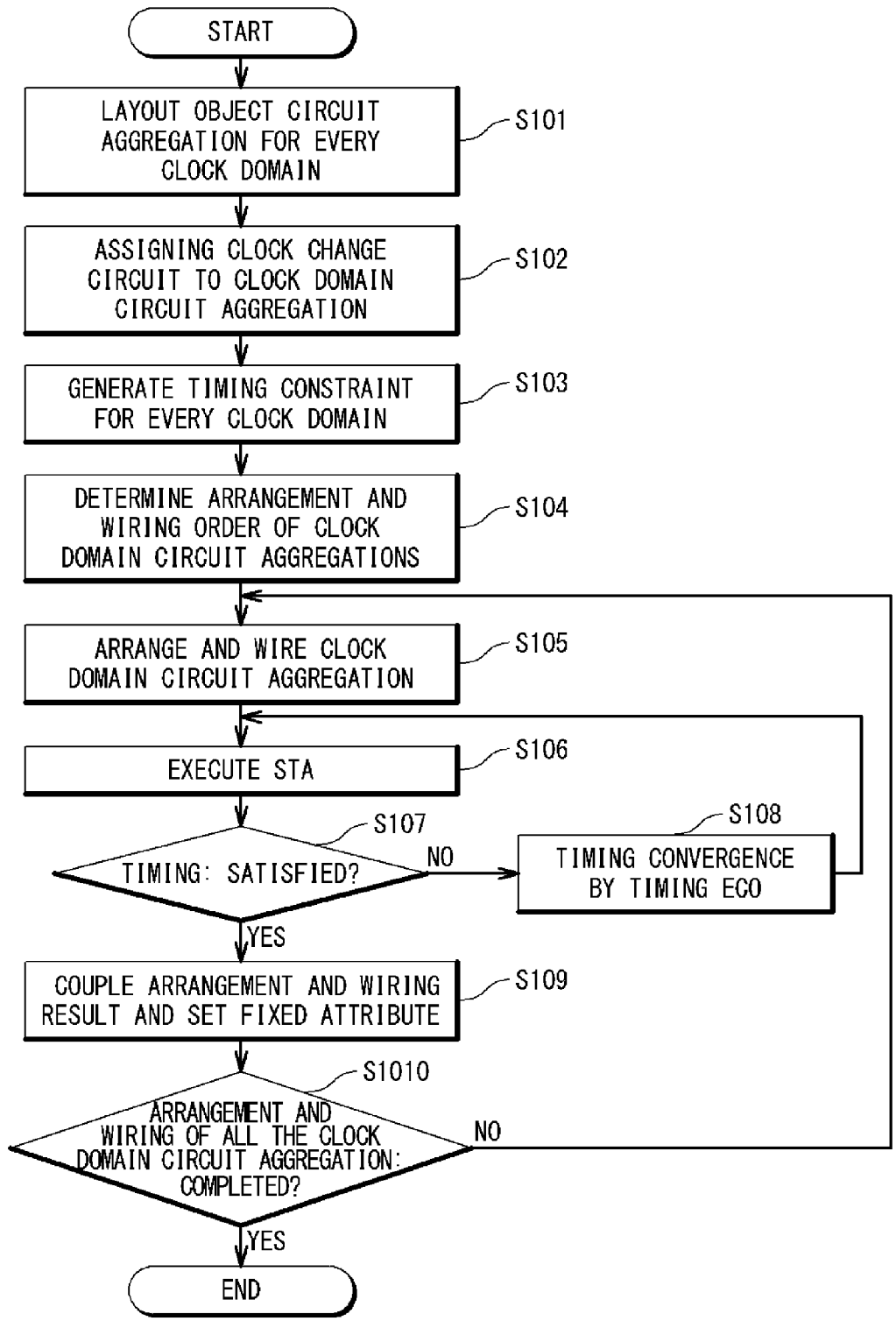
FIG. 3 is a flow chart showing a procedure of the processing of the present invention.

FIG. 3 is a flow chart showing an operation procedure of the present invention. The computer terminal 10 extracts circuits connected with each clock through a forward search of a net list of an LSI circuit from a start point of the clock, and generates an aggregation of layout object circuits for every clock domain (hereinafter, to be referred to as a clock domain circuit aggregation) (Step S101). The circuits to a clock change flip-flop circuit are assigned to a driver-side clock domain circuit aggregation. Then, the clock change flip-flop circuit is further assigned to a receiver-side clock domain circuit aggregation (Step S102). A timing constraint is generated every clock domain (Step S103).

An arrangement and wiring order of the clock domain circuit aggregation is determined (Step S104). After the clock domain circuit aggregation is arranged and wired (Step S105), static timing analysis (STA) is executed (Step S106) to determine whether or not the arranged clock domain circuit aggregation satisfies a timing constraint (Step S107). If the timing constraint is not satisfied at the step S107, Timing ECO is executed, that is, timing is converged through a circuit change for timing adjustment (Step S108). Then, the control flow returns to the step S106.

If the timing constraint is satisfied at the step S107, the current result of the arrangement and wiring of the clock domain circuit aggregation is coupled to a previous result of the arrangement and wiring result, and a fixed attribute is set such that a coordinate is not changed (Step S109). The control flow is completed when the arrangement and wiring of all the clock domain circuit aggregations is ended (Step S1010).

The control flow of FIG. 3 will be specifically described with reference to FIG. 2 to FIG. 10.

A net list N1 of a semiconductor integrated circuit (LSI circuit) as a layout object is stored previously in the storage unit 15. A plurality of the clock domain circuit aggregations are obtained by dividing the net list N1 of the semiconductor integrated circuit for every the clock domain. Specifically, a forward search of the net list N1 is carried out from the start points of the clocks A to C, and flip-flop circuits and circuits which are connected with the clocks A to C are extracted as L2, L4, L8, L10, L11, L15, L17, L19 and as L1, L3, L5, L6, L7, L9, L12, L13, L14, L16, L18, L20. Thus, the net lists N2 to N4 of the clock domain circuit aggregations for the clocks A to C are generated (Step S101).

Next, the clock change flip-flop circuit L11 is assigned to the driver-side clock domain circuit aggregation for the clock A (Step S102). Here, the flip-flop circuit L11 is the flip-flop circuit which receives data based on the clock A at a data terminal and the clock B at a clock terminal such that the clock change is carried out from the clock A to the clock B.

In this case, the clock change flip-flop circuit L11 is also assigned to the receiver-side clock domain circuit aggregation for the clock B at the step S101. Thus, the driver-side clock domain circuit aggregation containing the clock change flip-flop circuit L11 for the clock A, and the receiver-side clock domain circuit aggregation containing the clock change destination flip-flop circuit L11 for the clock B are generated.

Figure 4:
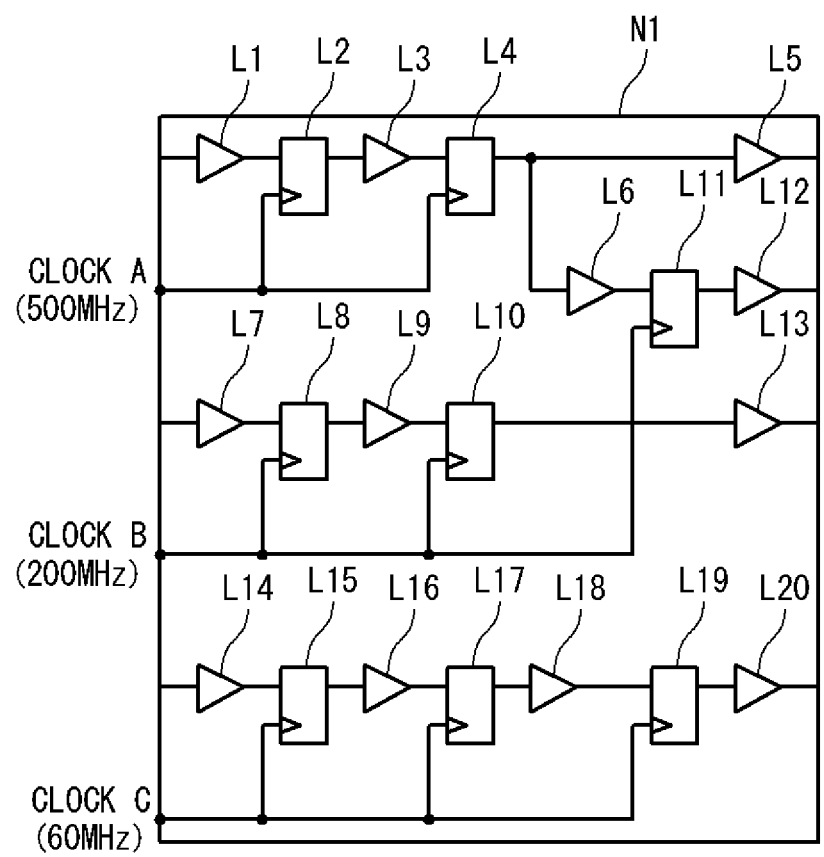
FIG. 4 is a diagram showing a net list N1 of a configuration example of circuits contained in a LSI circuit.

FIG. 4 shows all the circuits which are contained in the LSI circuit. N1 is a net list of the whole circuit. The clock domain circuit aggregation for the clock A contains the flip-flop circuits L2 and L4 which are connected with the clock A of 500 MHz, and the circuits L1, L3, and L5. Additionally, the clock domain circuit aggregation for the clock A contains the clock change flip-flop circuit L11 and the circuit 6 before the clock change flip-flop circuit L11. The clock domain circuit aggregation for the clock B contains the flip-flop circuit L8, L10 and L11 which are connected with the clock B of 200 MHz, and the circuits L7, L9, L12, and L13. The clock domain circuit aggregation for the clock C contains the flip-flop circuits L15, L17 and L19 which are connected with the clock C of 60 MHz, and the circuits L14, L16, L18, and L20.

Figure 5:
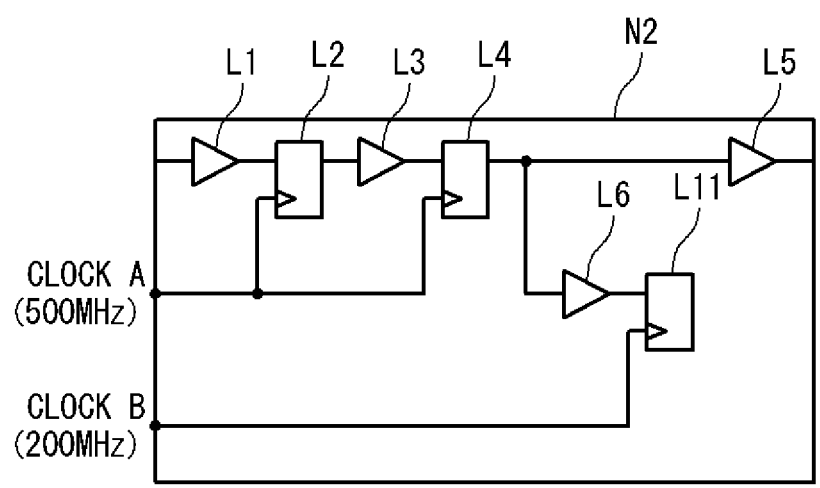
FIG. 5 is a diagram showing a net list N2 of a clock domain circuit aggregation for a clock A generated from the net list N1 of the LSI circuit of FIG. 4.

FIG. 5 is an example when the net list N2 of the clock domain circuit aggregation for the clock A is generated from the net list N1 of the LSI circuit of FIG. 4. The net list N2 contains the flip-flop circuits L2 and L4 which are connected with the clock A, and the circuit L1, L3, L5, and L6. The clock is changed from the clock A to the clock B on the flip-flop circuit L11, which is contained in the driver-side clock domain circuit aggregation for the clock A.

Figure 6:
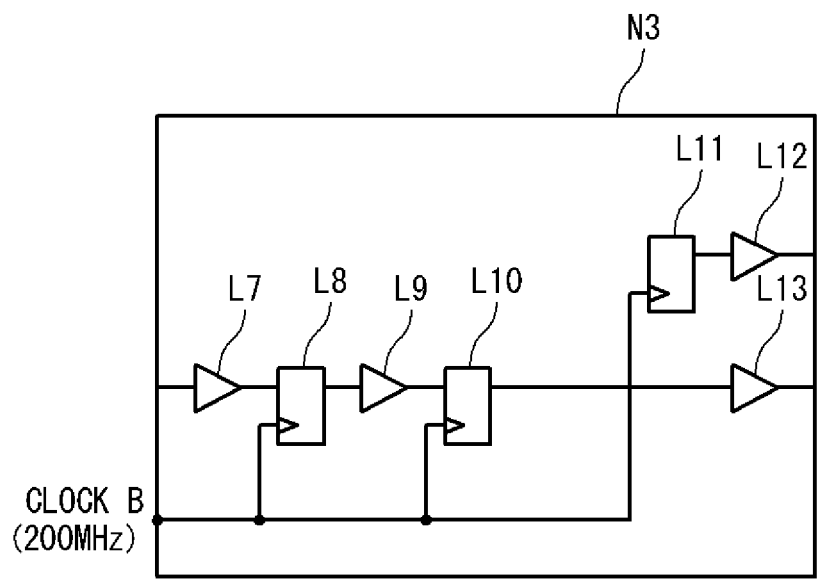
FIG. 6 is a diagram showing a net list N3 of a clock domain circuit aggregation for a clock B generated from the net list N1 of the LSI circuit of FIG. 4.

FIG. 6 is an example when the net list N3 of the clock domain circuit aggregation for the clock B is generated from the net list N1 of the LSI circuit of FIG. 4. The clock domain circuit aggregation contains the flip-flop circuits L8, L10 and L11 which are connected with the clock B, and the circuits L7, L9, L12, and L13. The flip-flop circuit L11 is the flip-flop circuit in which the clock is changed from the clock A to the clock B, is contained in the driver-side clock domain circuit aggregation for the clock A and is also contained in the receiver-side clock domain circuit aggregation for the clock B.

Figure 7:
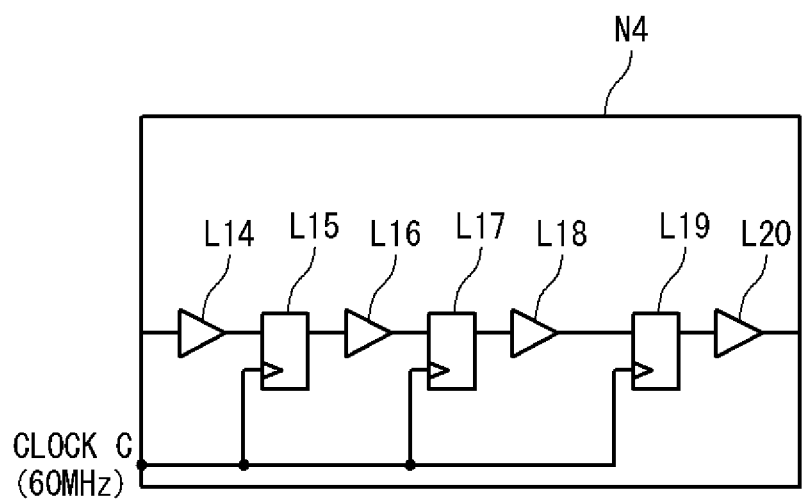
FIG. 7 is a diagram showing a net list N4 of a clock domain circuit aggregation for a clock C generated from the net list N1 of the LSI circuit of FIG. 4.

FIG. 7 is an example when the net list N4 of the clock domain circuit aggregation for the clock C is generated from the net list N1 of the LSI circuit of FIG. 4. The clock domain circuit aggregation contains the flip-flop circuits L15, L17 and L19 which are connected with the clock C, and the circuits L14, L16, L18, and L20.

Next, all the timing constraint such as a false path, a multi-cycle path, and clock definition for each clock domain circuit aggregation are extracted from the LSI circuit timing constraint. Thus, the timing constraint every the clock domain circuit aggregation is generated (Step S103).

Figure 8:
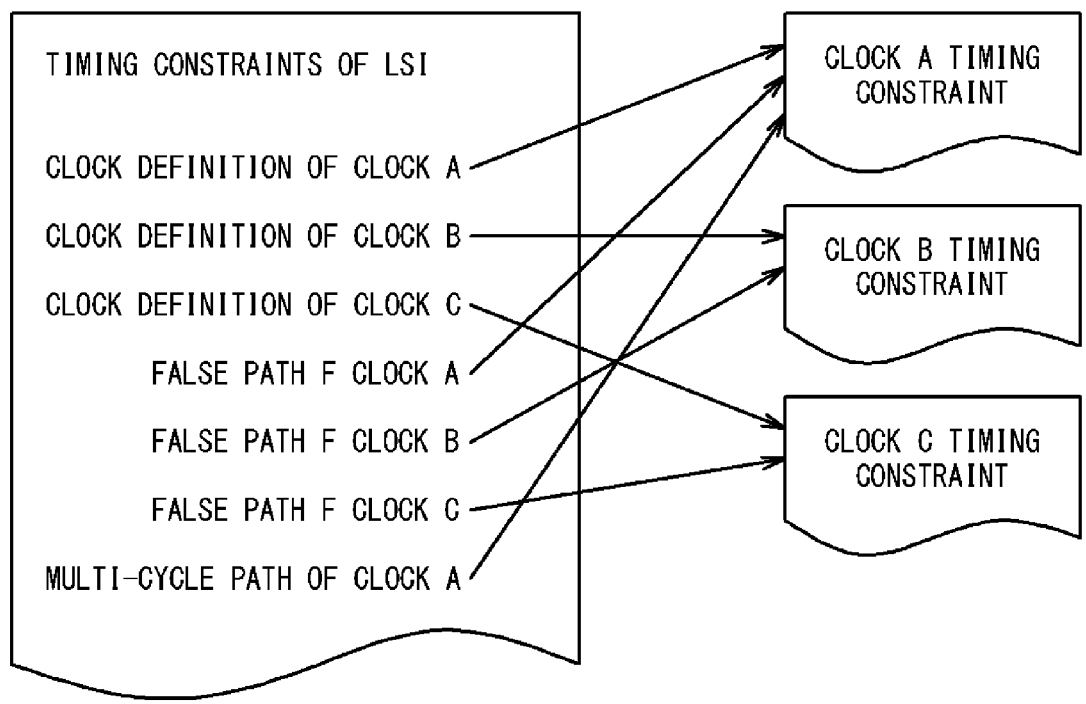
FIG. 8 is a diagram showing a timing constraint every clock generated from a timing constraint of the LSI circuit.

FIG. 8 is an example of timing constraint of the LSI circuit, such as the clock definitions, the false paths, and the multi-cycle path and so on, which are related to the clock A, the clock B and the clock C. The timing constraint of the LSI circuit are grouped into clock A timing constraint, clock B timing constraint, and clock C timing constraint. By extracting the constraint for each of the clocks A to C from the LSI circuit timing constraint, the timing constraint of each clock is generated. Thus, the timing constraint for each clock domain circuit aggregation is obtained.

Next, an arrangement and wiring order of each clock domain circuit aggregation is determined based on a predetermined reference which is determined based on the LSI circuit timing constraint (Step S104). Especially, it is effective to reduce TAT that the arrangement and wiring orders are determined in order from the clock of higher frequency.

Figure 9:
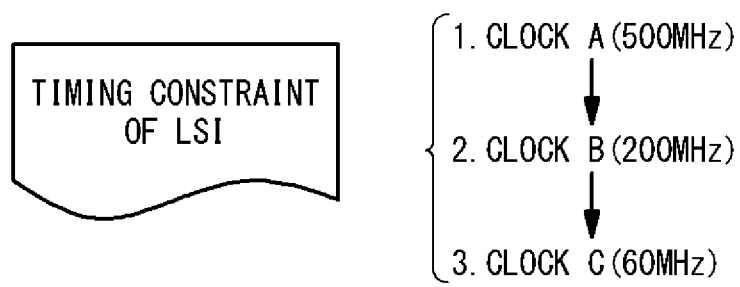
FIG. 9 is a diagram showing an arrangement and wiring order of the clock domain circuit aggregation determined from the timing constraint of the LSI circuit.

FIG. 9 is an example when the arrangement and wiring orders of the clock domain circuit aggregations are determined based on the LSI timing constraint. The clock A having the highest operation frequency of 500 MHz is determined as a first arrangement and wiring object. Next, the clock B having the operation frequency of 200 MHz is determined and then the clock C having the operation frequency of 60 MHz is determined. It should be noted that the determined order can be replaced optionally with the manual input operation from an input unit.

Next, the layout of the circuits corresponding to the net lists N2 to N4 of the clock domain circuit aggregations generated at the step S102 is carried out according to the arrangement and wiring order of the clock domain circuit aggregations determined at the step S104. First, the arrangement and wiring are carried out to the clock domain circuit aggregation for the clock A. The arrangement and wiring order of the clock domain circuit aggregations can be changed appropriately based on an input from the input unit. Next, STA is carried out to the clock domain circuit aggregation which is subjected to the arrangement and wiring (Step S106), to determine whether or not there is timing violation (Step S107). If there is the timing violation, the timing violation is corrected by using timing ECO (Step S108).

Here, circuits to the clock change flip-flop circuit L11 are contained in the clock domain circuit aggregation for the clock A at the step 102. Therefore, when the execution program of an arrangement algorithm based on the general technique is stored previously in the storage medium 15, and is executed, the clock change flip-flop circuit L11 is arranged near the flip-flop circuit L4 and the circuit L6 which drive the clock change flip-flop circuit L11. Also, in case of the arrangement and wiring of the clock domain circuit aggregation to which the clock change flip-flop circuit L11 belongs, because the clock domain circuit aggregation for the clock A is already arranged and wired, the circuit L12 driven by the flip-flop circuit L11 is arranged near the flip-flop circuit L11 based on the general arrangement technique.

In this case, if the clock domain circuit aggregation for the clock B which contains the clock change flip-flop circuit L11 is arranged and wired earlier, the flip-flop circuit L11 is arranged in a position to satisfy timing based on the general arrangement technique. Then, when the clock domain circuit aggregation for the clock A is arranged and wired, the flip-flop circuits L4 and the circuit L6 which drive the flip-flop circuit L11 are arranged near the flip-flop circuit L11 based on the general arrangement technique because the clock change flip-flop circuit L11 is already arranged and wired. It should be noted that the general technique may be used for the arrangement and wiring, the STA, and the timing ECO (Step S105, step S108).

Figure 10:
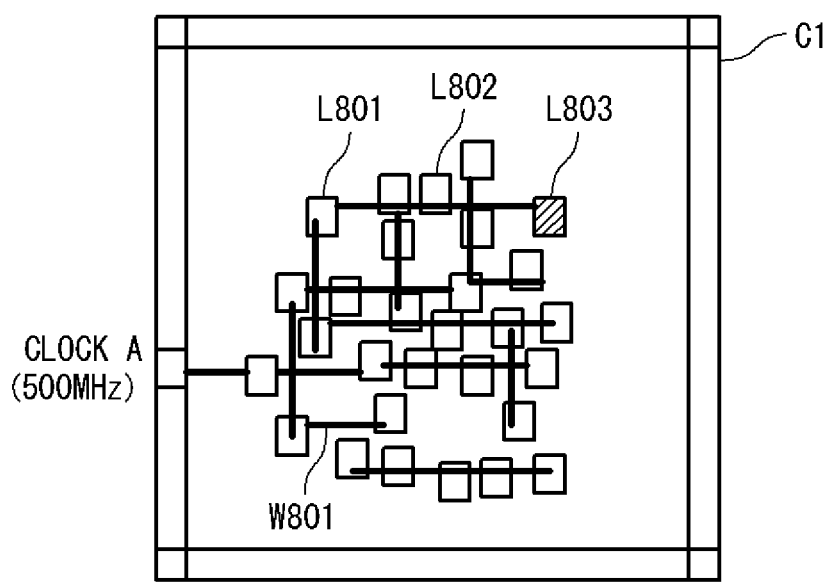
FIG. 10 is a diagram showing a state in which the clock domain circuit aggregation for the clock A with the highest frequency of 500 MHz is arranged and wired.

FIG. 10 is an example when the clock domain circuit aggregation for the clock A having the highest frequency of 500 MHz is arranged and wired. In FIG. 10, C1 is an LSI chip, L801 is a circuit connected with the clock A, W801 is a wiring, and L803 shows a clock change circuit. In this way, the circuit L801 which is connected with the clock A having the high frequency can be arranged and wired while using the chip area freely, to facilitate the timing convergence. In this case, the clock change circuit L803 is arranged near the driver-side circuit L802 by a general arrangement tool based on the connection relation with the driver-side circuit L802.

It should be noted that when there is a circuit which is added for timing convergence in the arrangement and wiring, the added circuit is added to the net list N2 of the clock domain circuit aggregation generated at the step 101. Thus, when STA is carried out, the clock domain circuit aggregation for STA is specified by using the net lists N2 to N4 of the clock domain circuit aggregations.

Next, when satisfying the timing at the determination of step S107, the arrangement and wiring result of the clock domain circuit aggregation in which the timing is converged is coupled to the previous result of the arrangement and wiring of the clock domain circuit aggregation(s). After the coupling, fixed attribute is set such that the arrangement and wiring is not changed in the arrangement and wiring of the next clock domain circuit aggregation (Step S109).

Next, when there is a remaining clock domain circuit aggregation which is not yet arranged, the control flow returns to the step S105. The processing of the step S105 and the subsequent is repeated, until all the clock domain circuit aggregations are arranged and wired. The control flow completes at the time when all the clock domain circuit aggregations are processed (Step S1010).

Figure 11:
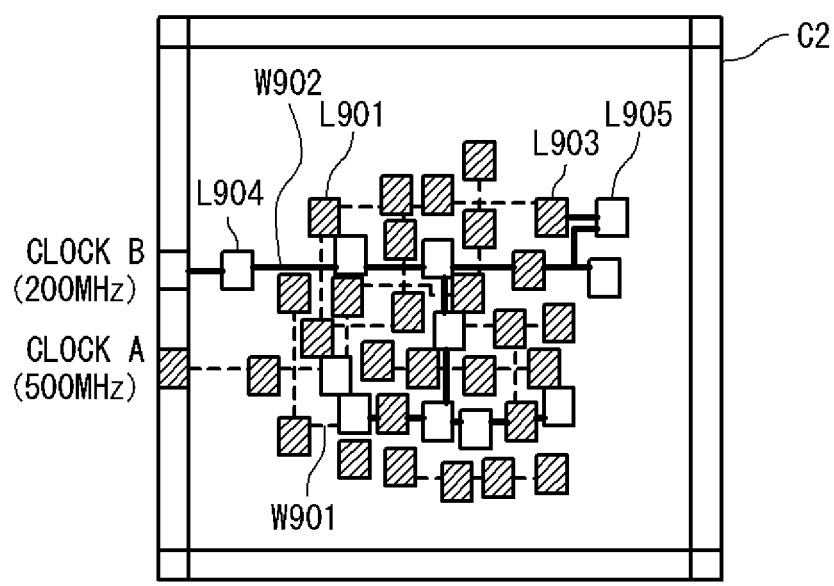
FIG. 11 is a diagram showing a state in which the clock domain circuit aggregation for a clock B with a frequency of 200 MHz which is higher next to that of the clock A is arranged and wired.

FIG. 11 is an example when the clock domain circuit aggregation for the clock B having the frequency of 200 MHz which is higher next to the clock A is arranged and wired. In FIG. 11, C2 denotes an LSI chip, L901 denotes the already arranged circuits which is connected with the clock A, W901 denotes wirings by the already arranged circuits which is connected with the clock A, L904 denotes circuits which are connected with the clock B, and W902 denotes wirings which are connected with the clock B. In this case, the clock change circuit L903 is already arranged on the arrangement and wiring of the clock domain circuit aggregation for the clock A, and the circuit L905 on the receiver side of the clock change circuit L903 is arranged near the clock change circuit L903 by the general arrangement tool.

In this way, by carrying out the arrangement and wiring of the clock domain circuit aggregation for the clock A before the arrangement and wiring of the clock domain circuit aggregation for the clock B, it is possible to carry out the arrangement and wiring of the clock domain circuit aggregation for the clock B in consideration of the arrangement and wiring result of the clock domain circuit aggregation for the clock A.

Figure 12:
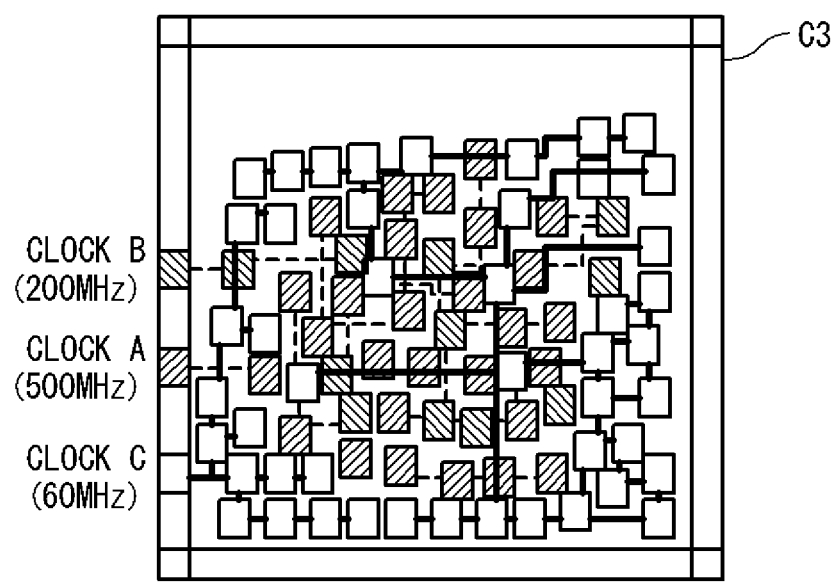
FIG. 12 is a diagram showing a state in which the last clock domain circuit aggregation for a clock C is arranged and wired.

FIG. 12 is an example of the result of the arrangement and wiring of the clock domain circuit aggregation for the clock C. In FIG. 12, C3 denotes a LSI chip, and the clock domain circuit aggregation which is connected with the clock C is arranged and wired in an area except the area of the already arranged and wired circuits, similarly to FIG. 11.

As described above, the following effect is obtained by the method of supporting layout design of the first embodiment. By carrying out the arrangement and wiring in order from the clock domain circuit aggregation having severe timing from among the clock domain circuit aggregations, it is possible to primarily arrange and wire the circuit on a path in which the timing is severe, in an area with a margin. Because the circuit on the path in which the timing is severe can be arranged and wired freely in an optional position to satisfy the timing constraint, TAT of the timing convergence in the layout design can be shortened.

It should be noted that after the arrangement and wiring of all the clock domain circuit aggregations are completed, the timings of the clock domain circuit aggregations for the clocks A to C are fixed, even when the timing violation due to crosstalk and so on occurs as the result that STA of the LSI chip C3 is carried out, and the timing violation due to the whole LSI chip C3 can be corrected through a fine control of the circuit arrangement and wiring.

Second Embodiment

The system configuration of a second embodiment is the same as that of the first embodiment and the description thereof is omitted. In the first embodiment, the arrangement and wiring order of the clock domain circuit aggregations is determined in order from the clock with the higher frequency based on the timing constraint of the LSI circuit (Step S104). In the second embodiment, the same arrangement and wiring order is assigned to a plurality of clock domain circuit aggregations such that the clock domain circuit aggregations are arranged and wired at a same time. The clock domain circuit aggregations of the same order can be specified by an external input.

By collectively carrying out the arrangement and wiring to the plurality of clock domain circuit aggregations which are related to each other, the arrangement and wiring are carried out in consideration of the connection relation of the clock domain circuit aggregations to facilitate the timing convergence of the clock domain circuit aggregations. Moreover, because it can be considered that the timing convergence is easy in the low-frequency clock domain circuit aggregations, the number of times of the arrangement and wiring is decreased by collectively arranging and wiring to shorten TAT of the layout design.

What is claimed is:

1. A method of supporting a layout design, comprising:
   dividing, by a processor, a net list of an integrated circuit into net lists of clock domain circuit aggregations;
   generating, by the processor, a timing constraint to each of said clock domain circuit aggregations;
   determining, by the processor, an arrangement order of said clock domain circuit aggregations to satisfy the timing constraint; and
   generating, by the processor, a layout of said integrated circuit by carrying out arrangement and wiring of said clock domain circuit aggregations based on said arrangement order.

2. The method according to claim 1, wherein said dividing comprises:
   carrying out, by the processor, a forward search on said net list of said integrated circuit from a clock start point;
   assigning, by the processor, circuits to a clock change flip-flop circuit to the net list of a driver-side one of said clock domain circuit aggregations; and
   assigning, by the processor, said clock change flip-flop circuit to a receiver-side one of said clock domain circuit aggregations.

3. The method according to claim 1, wherein said timing constraint contains a clock definition, a false path and a multi-cycle path.

4. The method according to claim 1, wherein said determining an arrangement order comprises:
   determining, by the processor, said arrangement order based on an operation frequency of each of said clock domain circuit aggregations.

5. The method according to claim 1, further comprising:
   changing, by the processor, said determined arrangement order based on supplied data.

6. The method according to claim 1, further comprising:
   carrying out, by the processor, STA (Static Timing Analysis) and timing ECO (Engineering Change Order) on a specified one of said clock domain circuit aggregations after said generating the layout of said integrated circuit.

7. The method according to claim 2, wherein said generating a layout of said integrated circuit comprises:
   connecting, by the processor, said driver-side one of said clock domain circuit aggregations based on an arrangement algorithm such that said driver-side clock domain circuit aggregation of said integrated circuit is arranged prior to said receiver-side clock domain circuit aggregation.

8. The method according to claim 7, wherein said generating a layout of said integrated circuit comprises:
   connecting, by the processor, said receiver-side one of said clock domain circuit aggregations based on an arrangement algorithm such that said receiver-side clock domain circuit aggregation is arranged near said driver-side clock domain circuit aggregation.

9. The method according to claim 1, wherein said generating a layout of said integrated circuit comprises:
   arranging, by the processor, a current one of said clock domain circuit aggregations based on said arrangement order;
   connecting, by the processor, said current clock domain circuit aggregation to a previous result in which at least one of said clock domain circuit aggregations is already arranged and wired; and
   setting, by the processor, a fixed attribute.

10. A computer-readable non-transitory storage medium in which a computer-executable program code is stored to attain a method of supporting a layout design, which comprises:
    dividing a net list of an integrated circuit into net lists of clock domain circuit aggregations;
    generating a timing constraint to each of said clock domain circuit aggregations;
    determining an arrangement order of said clock domain circuit aggregations to satisfy the timing constraint; and
    generating a layout of said integrated circuit by carrying out arrangement and wiring of said clock domain circuit aggregations based on said arrangement order.

11. The computer-readable non-transitory storage medium according to claim 10, wherein said dividing comprises:
    carrying out a forward search on said net list of said integrated circuit from a clock start point;
    assigning circuits to a clock change flip-flop circuit to the net list of a driver-side one of said clock domain circuit aggregations; and
    assigning said clock change flip-flop circuit to a receiver-side one of said clock domain circuit aggregations.

12. The computer-readable non-transitory storage medium according to claim 10, wherein said timing constraint contains a clock definition, a false path and a multi-cycle path.

13. The computer-readable non-transitory storage medium according to claim 10, wherein said determining an arrangement order comprises:
    determining said arrangement order based on an operation frequency of each of said clock domain circuit aggregations.

14. The computer-readable non-transitory storage medium according to claim 10, wherein the method further comprises:
  changing said determined arrangement order based on supplied data.

15. The computer-readable non-transitory storage medium according to claim 10, wherein the method further comprises:
  carrying out STA (Static Timing Analysis) and timing ECO (Engineering Change Order) on a specified one of said clock domain circuit aggregations after said generating the layout of said integrated circuit.

16. The computer-readable non-transitory storage medium according to claim 11, wherein said generating a layout of said integrated circuit comprises:
  connecting said driver-side one of said clock domain circuit aggregations based on an arrangement algorithm such that said driver-side clock domain circuit aggregation of said integrated circuit is arranged prior to said receiver-side clock domain circuit aggregation.

17. The computer-readable non-transitory storage medium according to claim 16, wherein said generating a layout of said integrated circuit comprises:
  connecting said receiver-side one of said clock domain circuit aggregations based on an arrangement algorithm such that said receiver-side clock domain circuit aggregation is arranged near said driver-side clock domain circuit aggregation.

18. The computer-readable non-transitory storage medium according to claim 10, wherein said generating a layout of said integrated circuit comprises:
  arranging a current one of said clock domain circuit aggregations based on said arrangement order;
  connecting said current clock domain circuit aggregation to a previous result in which at least one of said clock domain circuit aggregations is already arranged and wired; and
  setting a fixed attribute.

\* \* \* \* \*